United States Patent [19]

Lang

[11] Patent Number: 5,355,388

[45] Date of Patent: Oct. 11, 1994

[54] ABERRATION CORRECTION OF UNSTABLE RESONATORS

[75] Inventor: Robert J. Lang, Pleasanton, Calif.

[73] Assignee: The United States of America as represented by the Administrator of the National Aeronautics and Space Administration, Washington, D.C.

[21] Appl. No.: 20,813

[22] Filed: Feb. 22, 1993

[51] Int. Cl.⁵ .............................................. H01S 3/08
[52] U.S. Cl. ........................................ 372/99; 372/95
[58] Field of Search ...................................... 372/95, 99

[56] References Cited

U.S. PATENT DOCUMENTS

| | | | |
|---|---|---|---|
| 4,096,447 | 6/1978 | Fluhr | 331/94.5 |
| 4,433,418 | 2/1984 | Smith | 372/95 |
| 4,477,909 | 10/1984 | Salvi et al. | 372/95 |
| 5,058,123 | 10/1991 | Yasui et al. | 372/95 |
| 5,179,568 | 1/1993 | Lang | 372/95 |

OTHER PUBLICATIONS

R. J. Lang, "Geometric formulation of unstable resonator design and application to self-collimating unstable-resonator diode lasers", Opt. Lett. 16, No. 17, pp. 1319-1321–Sep. 1, 1991.

T. R. Ferguson and M. E. Smithers "Optical resonators with nonuniform magnification," J. Opt. Soc. Am. A1, pp. 653-662, Jun., 1984.

Primary Examiner—James W. Davie
Attorney, Agent, or Firm—John H. Kusmiss; Thomas H. Jones; Guy M. Miller

[57] ABSTRACT

Construction of aspheric reflectors for unstable-resonator lasers to provide an arbitrary laser mode inside the resonator to correct aberrations of an output beam by the construction of the shape of an end reflector opposite the output reflector of the resonator cavity, such as aberrations resulting from refraction of a beam exiting the solid of the resonator having an index of refraction greater than 1 or to produce an aberration in the output beam that will precisely compensate for the aberration of an optical train into which the resonator beam is coupled.

4 Claims, 4 Drawing Sheets

ABERRATION CORRECTION OF UNSTABLE RESONATORS

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to aberration-corrected unstable laser resonators, and particularly to solid unstable resonator diodes, in which aberrations of an output beam are corrected by the construction of the shape of an end reflector opposite the output reflector of the resonator cavity.

BACKGROUND ART

Unstable resonators (URs) have been used for years for high power lasers due to their large mode volumes. In the 1970s and early 1980s, they were applied to semiconductor lasers with mixed results. Recently there has been renewed interest in the use of unstable resonators for diode lasers. Advances in material uniformity and facet etching techniques have realized unstable resonator diode lasers that show good agreement between theory and experiment.

UR's for diode lasers are unique among UR's for several reasons. They are usually solid resonators whose outputs are taken through one of the end mirrors of its resonant cavity, and so the output beam is defocused by refraction as it leaves the resonator. Such refraction is acceptable because it may be refocused externally.

Due to their high gain, UR diode lasers are relatively short compared with their width, yielding high numerical aperture operation. The combination of these two factors with the use of circular reflective mirrors can lead to a significant spherical aberration in the output beam. However, because the etched facets of UR diode lasers are lithographically formed, the mirrors are not restricted to circular segments.

In principle, any mirror shape is possible. While the shape of the mirror determines both the shape of the mode and the effect of refraction through the output facet (hereinafter referred to as a mirror or reflector), it should be possible to construct a mirror shape that will yield an arbitrary mode pattern in the resonator, or equivalently, an arbitrary field pattern outside the resonator.

STATEMENT OF THE INVENTION

The invention provides, in the limit of geometric optics, construction of an end reflector opposite the output reflector of an unstable resonator diode with a shape that will yield such an arbitrary mode pattern outside the resonator cavity, or equivalently, an arbitrary mode pattern inside the cavity, that aberration in the output beam is eliminated, or in the alternative that aberration is purposely introduced and tailored to correct for known aberration of subsequent optics outside the unstable resonator cavity. In either case, an unstable resonator is provided with tailored aberration correction, by so constructing the shape of the end reflector opposite a predefined output reflector that aberration which would otherwise have been introduced by the output reflector is corrected, or aberration that is introduced by downstream optics outside the resonator cavity is corrected.

The shape of the output reflector is specified parametrically for a desired mode to be the locus of positions (points) defined in a two-dimensional Cartesian coordinate system of mutually perpendicular axes, x and y by ordered pairs of coordinates $x_l(z)$, $y_l(z)$, where $x_l$ and $y_l$ are known functions of a parameter z, and its mode pattern in the resonator cavity is specified by the angle $\phi_l(z)$ of its rays with respect to the x axis of the unstable resonator. Since the active region of a diode laser is virtually a two-dimensional plane, the shape of the cavity mirrors is fully defined in a two-dimensional coordinate system. Therefore, the letter z does not represent an axis of a three-dimensional coordinate system; instead, the letter z is used herein to represent a parameter for the parametric curve of each reflector shape. The subscripts 0 and 1 for the parameter z are then used to designate a point of origin for a ray and a point of subsequent reflection by the same reflector. The subscripts l and r for the coordinates x and y and angle $\phi$ designate parameters of the left (output) and the right (opposite end) reflectors, respectively, when the resonator is viewed from the side that places the output mirror on the left, as shown in the drawings.

The shape of the opposite end reflector is chosen so that a ray outside the resonator cavity exiting from the output reflector at a position specified by parameter $z_0$ (or equivalently a ray inside the resonator cavity) is reflected by the opposite end reflector to the output reflector at a position $x_l(z)$, $y_l(z)$ for some different parameter $z_1$, which position of the output reflector is a fixed function of both $z_0$ and the coordinates $x_r(z_0)$, $y_r(z_0)$. By treating the coordinates $x_r$ and $y_r$ as functions of both $z_0$ and $z_1$ and deriving a condition that gives the aberration correction functional form $z(z_0)$, the unknown coordinates $x_r$ and $y_r$ are determined from both the known coordinates $x_l(z)$, $y_l(z)$ of the output mirror and the known angle $\phi_l(z)$ of its rays that define the resonator mode.

The aberration-correction condition is derived from basic Eqs. (1) through (7) set forth below, where variables for the reflector operate the output reflector designated by the subscript r are unknown, but by solving for its derivative in Eq. (3), a differential Eq. (8) is constructed for $z_1$ which will specify the function $z_1(z_0)$. Simultaneous Eqs. (4) and (5) are solved for $\theta_r(z_0,z_1)$ which define the shape of the opposite end reflector necessary for aberration correction of an unstable resonator.

In the case of an unstable resonator that is solid with an index of refraction greater than the medium outside of the resonator, spherical aberration caused by refraction as the beam exits the output mirror (coupler) may be corrected by so intentionally distorting the output mirror that the aberrations of the resonator mode cancel the aberrations acquired by the refraction of the exiting beam through the output mirror.

DETAILED DESCRIPTION OF THE INVENTION

As examples of the application of the present invention to solid UR's, mirrors of several aberrationless resonators of interest will be discussed, including a resonator with ideal spherical-wave modes, a half-symmetric resonator with a predistorted mode, whose output beam has identically zero spherical aberration after refraction through its output mirror and a self-collimated unstable resonator.

Figure 1:
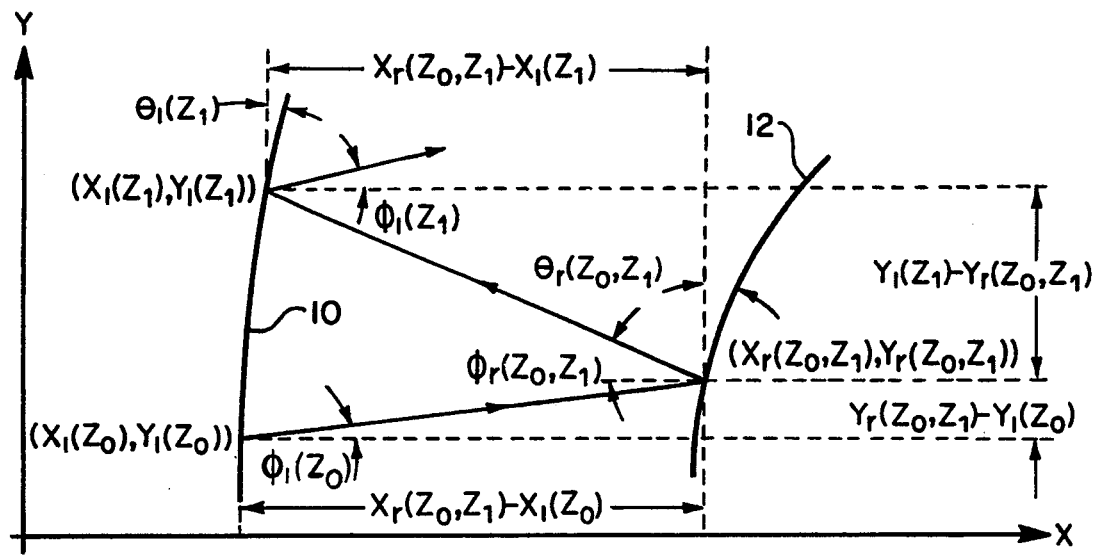
FIG. 1 is a schematic of a generalized unstable resonator, UR, in which the left mirror is specified parametrically as $x_l(z),y_l(z)$, the mode is specified by the angle of its rays, $\phi_l(z)$, with respect to the resonator axis, and the right mirror is to be determined.

Consider a general UR illustrated in FIG. 1, in which the shape of the surface of the left mirror 10 is specified parametrically. That surface is taken to be the locus points of ordered coordinate pairs $x_l(z)$, $y_l(z)$, where $x_l$ and $y_l$ are known functions of a parameter z. Assume that the fundamental mode of this resonator is described well by ray optics, in which the field at any point in the resonator can be characterized by giving the direction of propagation of a ray. This is generally the case in unstable resonators. By specifying the desired mode in terms of the direction of the ray emanating from position $x_l(z)$, $y_l(z)$, and denoting that direction as angle $\phi_l(z)$, which is also a known function of z, it is possible to correct aberration of the ray by the output mirror 10 on the left by defining the shape of the end mirror 12 on the right.

The reflected ray leaving the left mirror 10 at position $x_l(z_0), y_l(z_0)$, and angle $\phi_l(z_0)$ will strike the right mirror 12 at a point $x_r(z_0), y_r(z_0)$ and be reflected. Parameterization of the right mirror 12 may be freely chosen so that a ray leaving the left mirror 10 from a position specified by parameter $z_0$ hits the right mirror 12 at a position specified by $z_0$. The ray will eventually hit the left mirror 10 again at a position $x_l(z_1)$, $y_l(z_1)$ for some different parameter $z_1$. For a given right mirror 12, $z_1$ is a fixed function of both $z_0$ and the coordinates $x_r(z_0)$, $y_r(z_0)$. By thus treating $x_r$ and $y_r$ as functions of both $z_0$ and $z_1$, then deriving a condition that gives the correct functional form of $z(z_0)$, the necessary shape of the right mirror 12 for aberration correction of the left mirror 10 is defined.

There are seven basic equations relating the mirror shapes and the angles shown in FIG. 1. The angles $\theta_l$ and $\theta_r$ at which the left and right mirrors 10 and 12 locally deviate from the y axis, i.e., the angles of inclination are related to the local gradient of the parametric mirror vector, the gradient taken with respect to the parameter. For the left mirror 10, $$\tan\theta_l(z_0) = \frac{\frac{dx_l(z_0)}{dz_0}}{\frac{dy_l(z_0)}{dz_0}}, \tag{1}$$

which is known since $x_l(z_0)$ and $y_l(z_0)$ are given. For the right mirror 12, $$\tan\theta_r(z_0, z_1) = \frac{\frac{dx_r(z_0, z_1)}{dz_0}}{\frac{dy_r(z_0, z_1)}{dz_0}}, \tag{2}$$

and since $x_r$ and $y_r$ are assumed to depend upon both $z_0$ and $z_1$, the total derivatives $d/dz$ in terms of partial derivatives $\partial/\partial z$ is given by $$\tan\theta_r(z_0, z_1) = \frac{\frac{\partial x_r(z_0, z_1)}{\partial z_0} + \frac{\partial x_r(z_0, z_1)}{\partial z_1}\frac{dz_1(z_0)}{dz_0}}{\frac{\partial y_r(z_0, z_1)}{\partial z_0} + \frac{\partial y_r(z_0, z_1)}{\partial z_1}\frac{dz_1(z_0)}{dz_0}}. \tag{3}$$

Further examination of FIG. 1 shows that the angles of inclination (angles with respect to the y axis) $\theta$ of the mirrors and the angles $\phi$ of the rays leaving each mirror are simply related; for reflection at the left mirror 10, $$\phi_r(z_0,z_1)=2\theta_l(z_1)+\phi_l(z_1). \tag{4}$$

and for reflection at the right mirror 12, $$\phi_l(z_0,z_1)=2\theta_r(z_0,z_1)+\phi_l(z_0). \tag{5}$$

Finally, the angle of each ray can be related to the distances along the x axis separating the points at which the rays hit each mirror. For the ray leaving the left mirror 10, $$\tan\theta_l(z_0) = \frac{y_r(z_0, z_1) - y_l(z_0)}{x_r(z_0, z_1) - x_l(z_0)} \tag{6}$$

while for the ray leaving the right mirror 12, $$\tan\theta_r(z_0, z_1) = \frac{y_l(z_1) - y_r(z_0, z_1)}{x_l(z_1) - x_r(z_0, z_1)}. \tag{7}$$

For the right mirror 12, all of the variables with an r subscript are unknown; for the left mirror 10, all of the variables with an l subscript are given. The variable $z_1$ is also unknown; however, it is possible to solve for its derivative in Eq. (3) to construct a differential equation for $z_1$:

$$\frac{dz_1(z_0)}{dz_0} = \frac{\frac{\partial x_r(z_0, z_1)}{\partial z_0} - \frac{\partial y_r(z_0, z_1)}{\partial z_0}\tan\theta_r(z_0, z_1)}{\frac{\partial x_r(z_0, z_1)}{\partial z_1} - \frac{\partial y_r(z_0, z_1)}{\partial z_1}\tan\theta_r(z_0, z_1)} \tag{8}$$

The difference between the numerator and the denominator of the right-hand side of Eq. (8) is that in the numerator the partial derivatives $\partial/\partial z$ are taken with respect to $z_0$, and in the denominator they are taken with respect to $z_1$.

Equation (8) will specify the function $z_1(z_0)$ and will ultimately give parametric representation of the right mirror 12. Eqs. (4) and (5) can be solved for $\theta_r(z_0,z_1)$ to yield $$\theta_r(z_0,z_1) = \theta_l(z_1) + \tfrac{1}{2}[\phi_l(z_1) - \phi_l(z_0)]. \tag{9}$$

It is useful to introduce two additional functions, $\rho(z)$ and $\sigma(z)$, to simplify algebra. Define $$\rho(z) \equiv \tan\phi_1(z), \tag{10}$$

$$\sigma(z) \equiv \tan\theta_1(z) = \frac{\frac{dx_1(z)}{dz}}{\frac{dy_1(z)}{dz}}, \tag{11}$$

where the second part of Eq. (11) follows from the definition in Eq. (1). Using these definitions and Eq. (9), $$\tan\theta_r(z_0,z_1) = \frac{\{\sqrt{[1+\rho^2(z_0)][1+\rho^2(z_1)]} - [1+\rho(z_0)\rho(z_1)]\} + \sigma(z_0)[\rho(z_1)-\rho(z_0)]}{[\rho(z_1)-\rho(z_0)] - \sigma(z_0)\{\sqrt{[1+\rho^2(z_0)][1+\rho^2(z_1)]} - [1+\rho(z_1)\rho(z_0)]\}} \tag{12}$$

Next, find formulae for $x_r$ and $y_r$. Solving Eqs. (6) and (7), and using definitions (10) and (11) gives $$x_r(z_0,z_1) = \frac{\tan\theta_r(z_0,z_1)x_1(z_1) + \rho(z_0)x_1(z_0) + [y_1(z_1) - y_1(z_0)]}{\tan\theta_r(z_0,z_1) + \rho(z_0)}, \tag{13}$$

and $$y_r(z_0,z_1) = \frac{\tan\phi_r(z_0,z_1)\rho(z_0)[x_1(z_1) - x_1(z_0)] + y_1(z_0) + \rho(z_0)y_1(z_1)}{\tan\phi_r(z_0,z_1) + \rho(z_0)}. \tag{14}$$

The remaining undefined quantity is $\tan\theta_r(z_0,z_1)$. Now using Eq. (4) and the definitions (10) and (11), write $$\tan\phi_r(z_0,z_1) = \frac{\rho(z_1)\sigma^2(z_1) - 2\sigma(z_1) - \rho(z_1)}{\sigma^2(z_1) + 2\rho(z_1)\sigma(z_1) - 1} \tag{15}$$

The remainder of the construction proceeds as follows: Eq. (15) is inserted into Eqs. (13) and (14); the partial derivatives with respect to $z_0$ and $z_1$ are taken; and the resulting equations, plus Eq. (12) are then used to construct the differential Eq. (8). This first-order nonlinear differential equation may be numerically integrated to give the function $z_1(z_0)$, which is then substituted into Eqs. (13) and (14) to yield the final right mirror 12 configuration.

It is not terribly useful to complete this construction in full generality, because the fully expanded derivatives cause the resulting expression for $dz_1/dz_0$ to occupy several pages. This renders the expression unwieldy. However, the construction is easily carried out by a symbolic manipulation computer program, e.g., Mathematica, version 2.0. The derivation can be considerably simplified by suitable choice of the left mirror and its parameterization.

Flat Output Coupler

In the following section, discussion is restricted to the special case of a half-symmetric resonator shown in FIG. 2, i.e., a resonator in which the left output mirror 10' is flat.

If the left mirror 10 is taken to be flat, then the following simple choice of parameterization suggests itself.

$$x_l(z) = 0, \quad y_l(z) = z \tag{16}$$

For the moment, $\rho(z)$ in Eq. (15) will be unspecified. Eq. (15) reduces to $$\tan\phi_r(z_0,z_1) = \rho(z_1), \tag{17}$$

and Eqs. (12)–(14) consequently simplify to $$\tan\theta_r(z_0,z_1) = \frac{\sqrt{[1+\rho^2(z_0)][1+\rho^2(z_1)]} - [1+\rho(z_0)\rho(z_1)]}{[\rho(z_1) - \rho(z_0)]}, \tag{18}$$

$$x_r(z_0,z_1) = \frac{z_1 - z_0}{\rho(z_1) + \rho(z_0)}, \tag{19}$$

$$y_r(z_0,z_1) = \frac{z_0\rho(z_1) + z_1\rho(z_0)}{\rho(z_1) + \rho(z_0)}. \tag{20}$$

With this simplification, the task of explicitly obtaining the differential equation for $z_1$, and calculating the partial derivatives is simplified as follows:

$$\frac{\partial x_r(z_0,z_1)}{\partial z_0} = \frac{-1}{\rho(z_1)+\rho(z_0)} - \frac{(z_1-z_0)\rho'(z_0)}{[\rho(z_1)+\rho(z_0)]^2}, \tag{21}$$

$$\frac{\partial x_r(z_0,z_1)}{\partial z_1} = \frac{1}{\rho(z_1)+\rho(z_0)} - \frac{(z_1-z_0)\rho'(z_1)}{[\rho(z_1)+\rho(z_0)]^2}, \tag{22}$$

$$\frac{\partial y_r(z_0,z_1)}{\partial z_0} = \rho(z_0)\left\{\frac{1}{\rho(z_1)+\rho(z_0)} + \frac{(z_1-z_0)\rho'(z_0)}{[\rho(z_1)+\rho(z_0)]^2}\right\}, \tag{23}$$

$$\frac{\partial y_r(z_0,z_1)}{\partial z_1} = \rho(z_0)\left\{\frac{1}{\rho(z_1)+\rho(z_0)} - \frac{(z_1-z_0)\rho'(z_1)}{[\rho(z_1)+\rho(z_0)]^2}\right\}. \tag{24}$$

If the function $F(z_0,z_1)$ is defined as $$F(z_0,z_1) \equiv ([\rho(z_1)-\rho(z_0)] + \rho(z_1)[\sqrt{[1+\rho^2(z_0)][1+\rho^2(z_1)]} - [1+\rho(z_0)\rho(z_1)]])([\rho(z_1)+\rho(z_0)] + [z_1-z_0]\rho'(z_0)), \tag{25}$$

the equation for the function $z_1(z_0)$ may be written in the pleasingly symmetric form, $$\frac{dz_1(z_0)}{dz_0} = \frac{F(z_0,z_1)}{F(z_1,z_0)}. \tag{26}$$

If the directions of the rays in FIG. 1 were reversed, the roles of $z_1$ and $z_0$ would reverse; the form of Eq. (26) is therefore a consequence of this symmetry.

These simplified expressions will now be used to work out two special cases as examples: first, when the mode inside the resonator is a perfect spherical wave; and second, when the mode outside the resonator is a perfect spherical wave after passing through an aberrative refractive output coupler.

Example: Spherical-wave mode

The foregoing solutions for $z_1(z_0), x_r(z_0)$, and $y_r(z_0)$ should reduce to the conventional theory of URs for a spherically diverging mode and spherical mirrors in the paraxial approximation. To check the theory, choose a mode with a virtual source point at depth $d=1$ (i.e., at position $(1,0)$) inside the resonator. Then $$\phi_f(z) = \tan^{-1} y_f(z) = \tan^{-1} z, \ \rho(z) = z. \tag{27}$$

Substituting this definition into Eq. (26) gives (after some algebraic reduction), $$\frac{dz_1}{dz_0} = \frac{z_1 \sqrt{z_1^2 + 1}}{z_0 \sqrt{z_0^2 + 1}}. \tag{28}$$

This nonlinear equation may be integrated to yield $$\frac{z_1}{1 + \sqrt{z_1^2 + 1}} = M \frac{z_0}{1 + \sqrt{z_0^2 + 1}}. \tag{29}$$

M is a constant of integration. In the limit of $z_1 \ll 1$, $z_0 \ll 1$, Eq. (29) reduces to $$z_1 = M z_0, \tag{30}$$

from which it is recognized that M is simply the geometric magnification of the resonator.

Solving Eq. (29) for $z_1(z_0)$ gives $$z_1(z_0) = \frac{2Mz_0(1 + \sqrt{1 + z_0^2}}{(1 + \sqrt{1 + z_0^2})^2 - Mz_0^2} \tag{31}$$

Analytic expressions for the right mirror shape can be found by noting that, according to Eqs. (19) and (20), $$x_r(z_0, z_1) = \frac{z_1 - z_0}{z_1 + z_0}, \ y_r(z_0, z_1) = \frac{2z_1 z_0}{z_1 + z_0}, \tag{32}$$

which gives an explicit parametric representation for the right mirror 12':

$$x_r = \frac{M-1}{M+1} \left( \frac{(1 + \sqrt{1 + z^2})^2 + Mz^2}{(1 + \sqrt{1 + z^2})^2 - Mz^2} \right), \tag{33}$$

$$y_r = \frac{4Mz}{M+1} \left( \frac{1 + \sqrt{1 + z^2}}{(1 + \sqrt{1 + z^2})^2 - Mz^2} \right). \tag{34}$$

By parametrically plotting $x_r(z)$ and $y_r(z)$ from Eqs. (33) and (34), the mirror shape is plotted.

Figure 2:
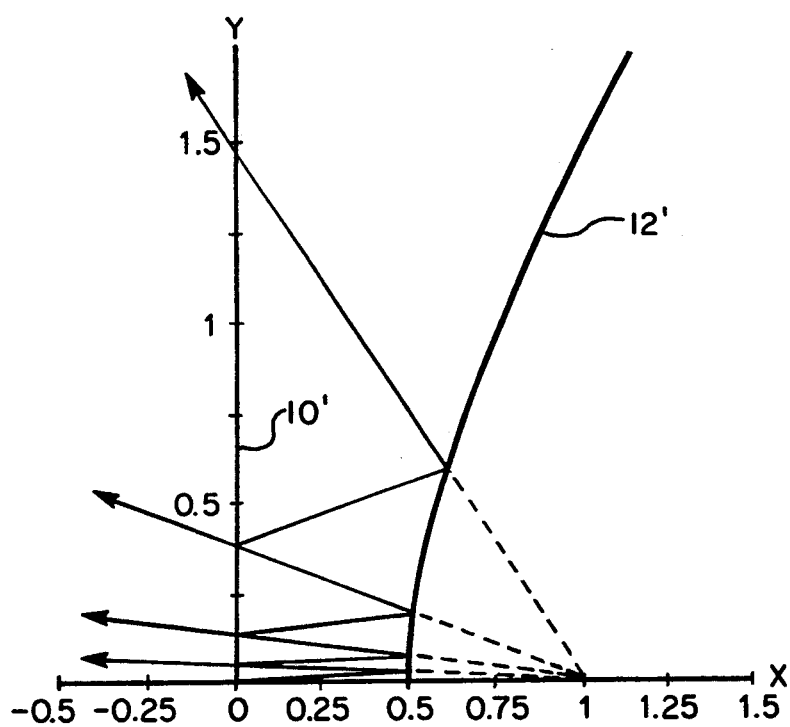
FIG. 2 is a plot mode of a mirror shape for magnification M=3 in accordance with the present invention for a spherical-wave optical mode. (Only the upper half of the mirror is plotted since it is symmetric about y=0.) Dashed lines trace the output rays back to the virtual source point.

In FIG. 2, the shape of the right mirror 12' for $M=3$ is plotted along with some representative rays. (Only the upper half of the mirror 12' is plotted; the resonator is symmetric about $y=0$). The shape of the right mirror 12' is a hyperbola. If z is eliminated from Equations (33) and (34), the equation for the right mirror is $$\frac{1}{(M-1)^2} x_r^2 - \frac{1}{4M} y_r^2 = \frac{1}{(M+1)^2}. \tag{35}$$

That the shape of the right mirror 12' is a hyperbola could also be deduced from the knowledge that a hyperbola can refocus a spherical wave to another spherical wave, a property that is used in the secondary reflector of a Cassegrainian telescope. In fact, for a virtual point source optical mode, the construction of FIG. 2 is equivalent to the design of a Cassegrain feed looking at itself in a planar mirror.

Example: Aberrationless output from a solid resonator

Although the mode of the resonator analyzed in the previous example is an aberrationless spherical wave inside the resonator, if the resonator is solid with an index of refraction greater than 1, the output beam will be refracted as it exits the resonator and will acquire some spherical aberration. It is possible, however, to intentionally distort the right mirror 12' opposite the output mirror 10' functioning as a coupler and, consequently so distort the resonator mode that the aberrations of the mode are precisely canceled by the aberrations acquired by refraction through the output coupler. It is this possibility that is most relevant to high-index, high-numerical-aperture UR diode lasers.

To implement this important case, the function $\phi(z)$ that yields an output with a virtual point source after refraction through the output reflector is calculated for use in the construction of the appropriate shape of the end reflector opposite the output reflector.

Figure 3:
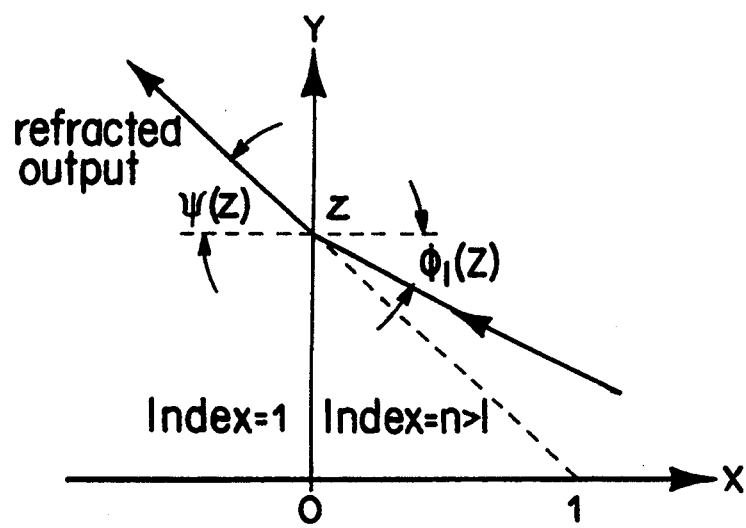
FIG. 3 shows the ray geometry for light refracted through a flat output coupler.

From the geometric construction shown in FIG. 3, it can be seen that for the output ray to have a virtual point source at depth $d=1$, it is necessary to have $$\tan \Psi(z) = z. \tag{36}$$

Snell's Law gives the desired $\phi_f(z)$:

$$\sin \phi_1(z) = \frac{1}{n} [\sin \psi(z)] = \frac{1}{n} \left[ \frac{z}{\sqrt{1 + z^2}} \right], \tag{37}$$

from which the parameterization is calculated, thus:

$$\rho(z) = \frac{z}{\sqrt{n^2 + z^2(n^2 - 1)}}. \tag{38}$$

Figure 5:
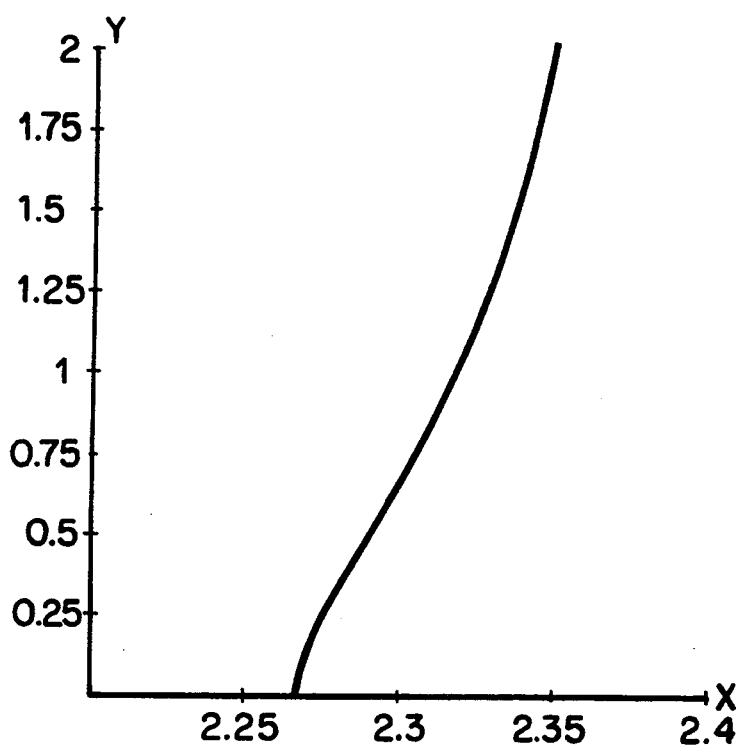
FIG. 5 is a plot of the mirror shape for an aberration-corrected solid UR with d=1, M=3, n=3.4. The horizontal scale has been exaggerated.
Figure 6:
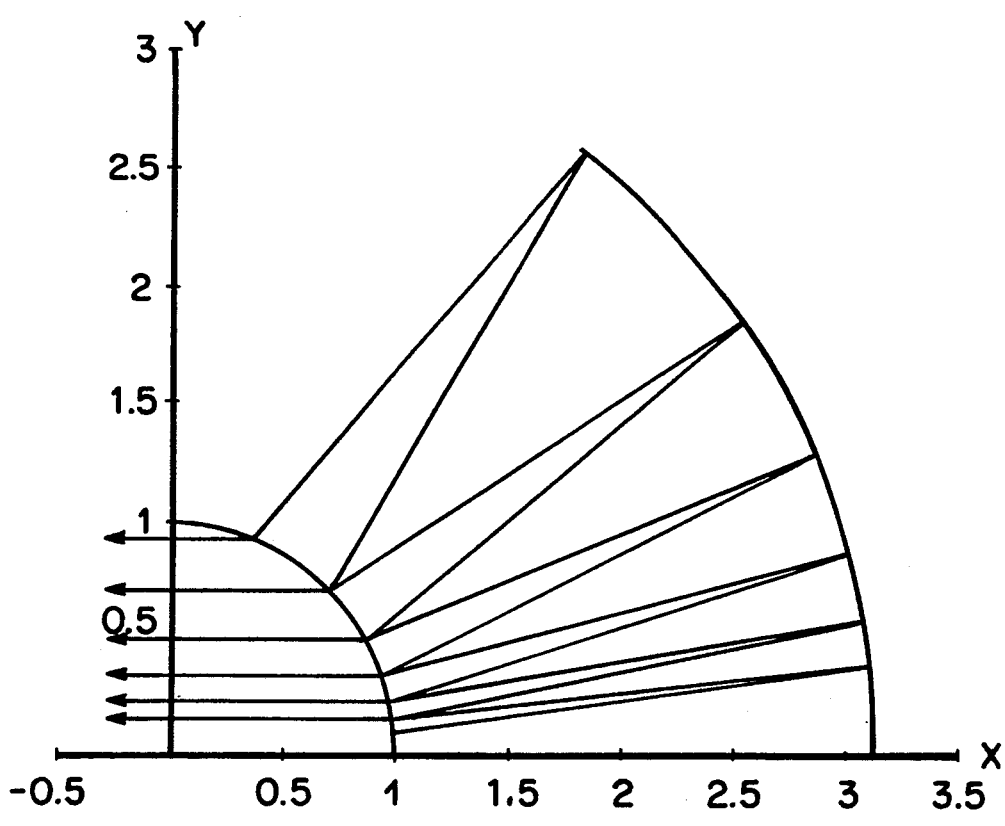
FIG. 6 is a plot of the mirrors and ray-tracing for an aberration-corrected self-collimating UR.

This expression, and its derivative, are substituted into Eqs. (25) and (26); the resulting differential equation, though complex, may be numerically integrated in a straightforward fashion. For the plots in FIGS. 4, 5 and 6, the fourth-fifth-order Runge-Kutta algorithm in the MATHEMATICA package Rungs Kutta, m was used.

There is one complication, however. As in Eq. (28), the differential equation for $z_1(z_0)$ has a singularity at $z_0=0$. In the numerical integration, this singularity may be avoided by beginning the integration at some nonzero value, $z_0=\epsilon$, and taking the initial condition to be $z_1(\epsilon) = M\epsilon$. M plays the role of the constant of integration and is the geometric magnification of the resonator. The solution for $z_1(z_0)$ may then be substituted into the expressions for $x_f(z_1,z_0)$ and $y_f(z_1,z_0)$ to obtain a parametric representation of the mirror shape.

Figure 4:
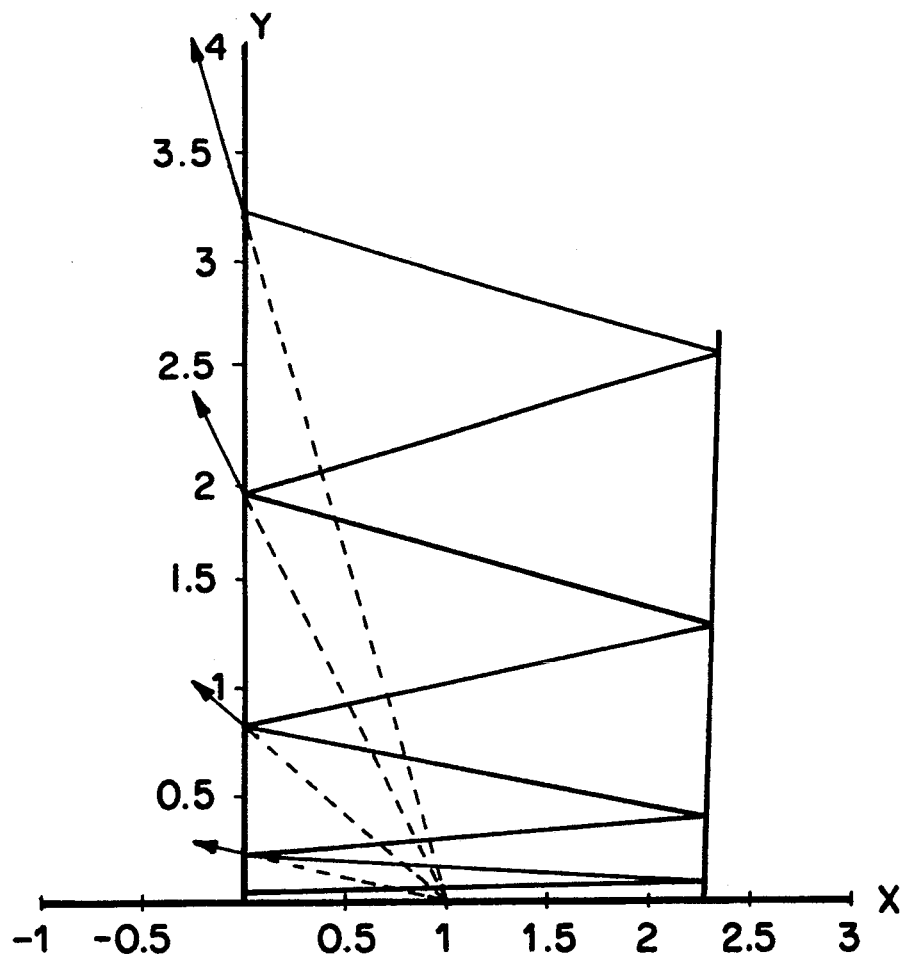
FIG. 4 is a plot of the mirror shape for an aberration-corrected solid UR with d=1, M=3, n=3.4. Dashed lines trace the output rays back to the virtual source point.

In FIG. 4, the solution for a practical resonator is plotted with virtual source at depth $d=1$, magnification $M=3$, and $n=3.4$ (the index of refraction of AlGaAs) along with the trajectories of several rays, both inside and outside the resonator. The mirror opposite the output coupler on the left, i.e., the right mirror, has been replotted in FIG. 5 with the horizontal scale exaggerated to emphasize the unusual shape of the mirror required to eliminate all aberrations. It is neither circular, as the paraxial geometric theory presupposes, nor is it hyperbolic, as the Cassegrainian virtual-point-source mode would specify. The modes of such a resonator are neither plane-wave nor spherical-wave; however, because of the refractive output coupler, the beam outside the resonator possesses a perfect point source.

Example: Self-collimating output

The effects of refraction for solid unstable resonators in the paraxial approximation have been calculated in a paper by R. J. Lang, titled "Geometric formulation of unstable-resonator design and application to self-collimating unstable-resonator diode lasers," *Opt. Lett.*, 16, No. 17, pp. 1–3, 1991. The calculations showed that a self-collimating positive-branch resonator exists for a range of magnifications below a critical value. By using this analysis with a nonzero $\sigma(z)$, it is possible to explicitly solve for the mirror shape for ideal self-collimation. If the left mirror is to be a defined semicircular mirror, it is possible to parameterize the mirror by setting $$x_f(z) = \cos z, \qquad (39)$$

and $$y_f(z) = \sin z. \qquad (40)$$

Therefore $$\sigma(z) = -\tan z. \qquad (41)$$

If a collimated output is required, it is necessary to have $$\rho(z) = \tan\left[z\left(1 + \frac{1}{n}\right)\right], \qquad (42)$$

where n is the index of refraction. Substitution of these functions into Eqs. (8–15) gives the equation of motion for $z_1$. While this equation is too complex to present here, it is quite straightforward to integrate. The solution for $n=3.4$, $M=1.5$ and some representative rays are plotted in FIG. 6.

The constant of integration M is the geometric magnification of the resonator along the optical axis. However, the magnification is, in general, nonuniform across the resonator. Consider a bundle of rays at the left-hand mirror that span the range $z_0$ to $z_0+\delta z$. After one round trip, it will span the range $z_1(z_0)$–$z_1(z_0+\delta z)$. The local magnification is therefore $$M(z_0) = \frac{dz_1(z_0)}{dz_0}. \qquad (43)$$

It has been shown by Ferguson and Smithers, "Optical resonators with nonuniform magnification," J. Opt. Soc. AM. A1, pp. 653–662, (1984), that the intensity profiles of the modes of resonators that have nonuniform local magnification may be derived from the local magnification function in a paraxial analysis. An extension of their analysis to the more general nonparaxial case described here is straightforward.

One of the interesting features of the resonators in the foregoing examples described above is that, since no paraxial approximations are being made, the results are exact even for light propagation nearly normal to the optical axis, although there are, of course, diffraction effects, which have not been included. While the examples have been based on relatively simple mirrors (namely, flat and circular), it is obviously possible to use this invention to construct a resonator with any shape mirror on the left side as an output coupler. Some truly bizarre structures with well-behaved modes are possible.

Example: Compensation aberrations of external optics

While an aberration-corrected resonator whose mirror is some arbitrary shape (say, a Gaussian) may be just a curiosity, this invention has a practical application. One could construct a resonator with an aberrated mode and an aberrated output that is precisely compensates for the known aberrations of subsequent optics in the optical train, such as those of a collimating lens.

Figure 7:
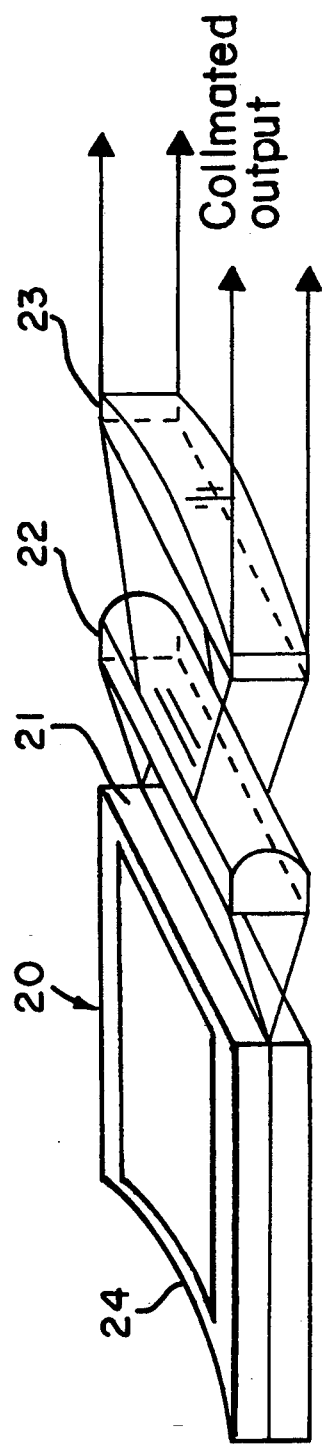
FIG. 7 illustrates an optical train for a half-symmetric UR with a collimated output. The rear mirror can be designed so that the laser mode precisely compensates for the aberrations of the subsequent optics outside the UR.

Such a design scenario for an unstable resonator diode laser 20 is illustrated in FIG. 7. It is desirable to have a flat output face 21 to allow butt-coupling to a cylindrical microlens 22, which may be fabricated with an aspherical cross section to collimate the beam in the vertical direction. This lens is followed by a conventional cylindrical lens 23 to collimate the beam laterally. Use of a conventional cylindrical lens for lateral collimation may introduce significant cylindrical aberration due to the high numerical aperture of the output beam. (The larger lateral dimension of hundreds of $\mu$m presumably precludes use of an aberration-corrected microlens.) By the method described above, it is possible to raytrace a theoretically collimated output back onto and through the laser facet, thereby calculating the desired $\phi_f(z)$ for the lasing mode. This $\phi_f(z)$, which will precisely compensate for the cumulative system aberration, may be used to calculate the shape of the rear mirror 24, which is then fabricated by lithographic methods and dry etching.

The techniques for mirror definition and etching for unstable resonator diode lasers are still in the early stages of development, as are UR diode lasers themselves. Nevertheless, as the ability to fabricate an arbitrary mirror shape of high optical quality becomes more readily available, it may be used to tailor the mirror shape to the requirements of the user. The traditional techniques of laser resonator design have been "Specify a resonator; calculate the resulting mode." By using the present invention, one may specify the properties of the desired mode and construct the resonator to fit. Consequently, the construction of unstable resonators as defined in the claims appended hereto with reference to mathematical equations constitutes construction of a resonator to fit the equations in a practical sense.

I claim:

1. An aberration-corrected unstable resonator comprising a resonant cavity between two reflectors in which aberrations of an output beam are corrected by the construction of a predefined end reflector opposite an output reflector of said resonator cavity with a shape that will yield such an arbitrary mode pattern outside said resonator cavity, or equivalently an arbitrary mode pattern inside said cavity, in which aberration in said output beam is eliminated, or in the alternative is purposely introduced and tailored to correct for known aberrations introduced by refraction of rays exiting said output reflector or by subsequent optics outside said unstable resonator cavity, thereby providing said output beam with tailored aberration correction by constructing said end reflector with said shape whereby aberration which would otherwise have been introduced by said output reflector is eliminated or aberration otherwise introduced outside said resonator cavity is corrected, wherein said shape of said output reflector is specified parametrically for a desired mode to be the locus of positions defined in a two-dimensional coordinate system of perpendicular axes x and y by ordered pairs of coordinates $x_l(z)$, $y_l(z)$, where $x_l$ and $y_l$ are known functions of a parameter z, and the mode pattern of said output reflector in said resonator cavity is specified by an angle $\phi_l(z)$ of its rays with respect to said x axis, and the shape of said end reflector opposite said output reflector is chosen to have the following parametric representation $$\theta_r(z_0,z_1) = \theta_l(z_1) + \tfrac{1}{2}[\phi_l(z_1) - \phi_l(z_0)]$$

so that a ray outside of said resonator cavity exiting said output reflector is reflected by said opposite end reflector at a position $x_r(z), y_r(z)$ for some different parameter $z_1$ which position of said output reflector is a fixed function of both $z_0$ and said coordinates $x_r(z_0), y_r(z_0)$, where the subscripts l and r for said coordinates x and y, and said angle $\phi$ designate parameters of said output reflector and said opposite end reflector, respectively, whereby, upon treating the coordinates $x_r$ and $y_r$ as functions of both $z_0$ and $z_1$, where the subscripts 0 and 1 for the parameter z designate parameters for a reflected ray leaving said output reflector and an exiting ray respectively, and deriving a condition that gives the aberration correction functional form $z(z_0)$, the coordinates $x_r$ and $y_r$ are determined from said known coordinates $x_l(z), y_l(z)$ of the output reflector and the known angle $\phi_l(z)$ of its rays that define the resonator mode by the following equations $$\tan\theta_l(z_0) = \frac{\frac{dx_1(z_0)}{dz_0}}{\frac{dy_1(z_0)}{dz_0}},$$

$$\tan\theta_r(z_0, z_1) = \frac{\frac{dx_r(z_0, z_1)}{dz_0}}{\frac{dy_r(z_0, z_1)}{dz_0}},$$

$$\tan\theta_r(z_0, z_1) = \frac{\frac{dx_r(z_0, z_1)}{dz_0}}{\frac{dy_r(z_0, z_1)}{dz_0}},$$

for said output reflector and said opposite end reflector, respectively, where $\theta$ and $\theta_r$ are angles of inclination with respect to said y axis, $x_1(z_0)$ and $y_1(z_0)$ are known, and $x_r$ and $y_r$ depend upon $z_0$ and $z_1$, whereby total derivatives in terms of partial derivatives are given by $$\tan\theta_r(z_0, z_1) = \frac{\frac{\partial x_r(z_0, z_1)}{\partial z_0} + \frac{\partial x_r(z_0, z_1)}{\partial z_1}\frac{dz_1(z_0)}{dz_0}}{\frac{\partial y_r(z_0, z_1)}{\partial z_0} + \frac{\partial y_r(z_0, z_1)}{\partial z_1}\frac{dz_1(z_0)}{dz_0}}$$

and the angles $\theta$ of inclination of said output reflector and said opposite end reflector and angles $\phi$ of the rays reflected by said output reflector and said opposite end reflector are related by the following equations:

$$\phi_r(z_0, z_1) = 2\theta_1(z_1) + \phi_1(z_1),$$

$$\phi_r(z_0, z_1) = 2\theta_r(z_0, z_1) + \phi_1(z_0),$$

$$\tan\theta_1(z_0) = \frac{y_r(z_0, z_1) - y_1(z_0)}{x_r(z_0, z_1) - x_1(z_0)},$$

$$\tan\theta_r(z_0, z_1) = \frac{y_1(z_1) - y_r(z_0, z_1)}{x_r(z_0, z_1) - x_1(z_1)}$$

for rays leaving said output reflector ($\phi_1$, $\theta_1$) and rays leaving said opposite end reflector ($\phi_r$, $\theta_r$), and upon solving the derivative of variable $z_1$ in the fourth equation set forth above to construct a differential equation for said variable $z_1$, thus $$\frac{dz_1(z_0)}{dz_0} = \frac{\frac{\partial x_r(z_0, z_1)}{\partial z_0} - \frac{\partial y_r(z_0, z_1)}{\partial z_0}\tan\theta_r(z_0, z_1)}{\frac{\partial x_r(z_0, z_1)}{\partial z_1} - \frac{\partial y_r(z_0, z_1)}{\partial z_1}\tan\theta_r(z_0, z_1)}$$

to specify a function $z_1(z_0)$ to solve for $\theta_r(z_0,z_1)$ simultaneous equations for reflection at the left mirror $$\phi_r(z_0,z_1) = 2\theta_l(z_1) + \phi_l(z_1)$$

and for reflection at the right mirror, $$\phi_r(z_0,z_1) = 2\theta_r(z_0,z_1) + \phi_l(z_0)$$

to yield $$\theta_r(z_0,z_1) = \theta_1(z_1) + \tfrac{1}{2}[\phi_l(z_1) - \phi_l(z_0)]$$

which defines the shape of said opposite end reflector required to correct for aberration of said unstable resonator.

2. An aberration-corrected unstable resonator as defined in claim 1 wherein said output reflector is flat, $$x_1(z) = 0,$$

$$y_1(z) = z,$$

$$\tan\phi_r(z_0, z_1) = \rho(z_1),$$

so that $$\tan\theta_r(z_0, z_1) = \frac{\sqrt{[1 + \rho^2(z_0)][1 + \rho^2(z_1)]} - [1 + \rho(z_0)\rho(z_1)]}{[\rho(z_1) - \rho(z_0)]},$$

$$x_r(z_0, z_1) = \frac{z_1 - z_0}{\rho(z_1) + \rho(z_0)},$$

$$y_r(z_0, z_1) = \frac{z_0\rho(z_1) + z_1\rho(z_0)}{\rho(z_1) + \rho(z_0)},$$

from which said differential equation for $z_1$ is explicitly obtained and said partial derivatives are simplified as follows:

$$\frac{\partial x_r(z_0, z_1)}{\partial z_0} = \frac{-1}{\rho(z_1) + \rho(z_0)} - \frac{(z_1 - z_0)\rho'(z_0)}{[\rho(z_1) + \rho(z_0)]^2},$$

$$\frac{\partial x_r(z_0, z_1)}{\partial z_1} = \frac{1}{\rho(z_1) + \rho(z_0)} - \frac{(z_1 - z_0)\rho'(z_1)}{[\rho(z_1) + \rho(z_0)]^2},$$

$$\frac{\partial y_r(z_0, z_1)}{\partial z_0} = \rho(z_0)\left(\frac{1}{\rho(z_1) + \rho(z_0)} + \frac{(z_1 - z_0)\rho'(z_0)}{[\rho(z_1) + \rho(z_0)]^2}\right),$$

$$\frac{\partial y_r(z_0, z_1)}{\partial z_1} = \rho(z_0)\left(\frac{1}{\rho(z_1) + \rho(z_0)} - \frac{(z_1 - z_0)\rho'(z_1)}{[\rho(z_1) + \rho(z_0)]^2}\right),$$

so that by setting a function $F(z_0, z_1)$ as $$F(z_0, z_1) \equiv ([\rho(z_1) - \rho(z_0)] + \rho(z_1)[\sqrt{[1 + \rho^2(z_0)][1 + \rho^2(z_1)]} - [1 + \rho(z_0)\rho(z_1)]])([\rho(z_1) + \rho(z_0)] + [z_1 - z_0]\rho'(z_0)),$$

said function $z_1(z_0)$ takes on a symmetric form $$\frac{dz_1(z_0)}{dz_0} = \frac{F(z_0, z_1)}{F(z_1, z_0)}.$$

3. An aberration-corrected unstable resonator as defined in claim 2 wherein said resonator comprises a solid with an index of refraction greater than 1 such that said output beam is refracted as it passes through said output reflector, and wherein said end reflector opposite said output reflector is constructed with a function $\phi(z)$ that yields an output beam with a virtual point source at depth $d = 1$ after refraction through said output reflector such that $\tan \Psi(z) = z$, and from Snell's Law, the desired $\phi_1(z)$ is given by $$\sin\phi_1(z) = \frac{1}{n}[\sin\psi(z)] = \frac{1}{n}\left[\frac{z}{\sqrt{1 + z^2}}\right],$$

from which the parameterization is calculated, thus:

$$\rho(z) = \frac{z}{\sqrt{n^2 + z^2(n^2 - 1)}},$$

where, upon the expression for $\rho(z)$ and its derivative, being substituted in $$F(z_0, z_1) \equiv ([\rho(z_1) - \rho(z_0)] + \rho(z_1)[\sqrt{[1 + \rho^2(z_0)][1 + \rho^2(z_1)]} - [1 + \rho(z_0)\rho(z_1)]])([\rho(z_1) + \rho(z_0)] + [z_1 - z_0]\rho'(z_0)),$$

and $$\frac{dz_1(z_0)}{dz_0} = \frac{F(z_0, z_1)}{F(z_1, z_0)},$$

the differential equation for $z_1(z_0)$ has a singularity at $z_0 = z$, which is avoided by beginning the integration at some nonzero value, $z_0 = \epsilon$, and taking the initial condition to be $z_1(\epsilon) = M\epsilon$, where M plays the role of a constant of integration and is a geometric magnification factor of the resonator.

4. An aberration-corrected unstable resonator as defined in claim 2 wherein said unstable resonator is optically coupled to an optical train having a known aberration, said unstable resonator having said end reflector opposite said output reflector, said output reflector being constructed intentionally with an aberrated mode and an aberrated output that precisely compensates for said known aberration of said optical train into which said output beam of said unstable resonator is coupled.

* * * * *